United States Patent [19]
Klank et al.

[11] 4,334,318
[45] Jun. 8, 1982

[54] BROADCAST RECEIVER TUNING CIRCUIT

[75] Inventors: Otto Klank, Lehrte-Arpke; Wilfried Wähling, Hanover, both of Fed. Rep. of Germany

[73] Assignee: Licentia Patent-Verwaltungs-G.m.b.H., Frankfurt am Main, Fed. Rep. of Germany

[21] Appl. No.: 133,988

[22] Filed: Mar. 26, 1980

[30] Foreign Application Priority Data

Mar. 30, 1979 [DE] Fed. Rep. of Germany ....... 2912710

[51] Int. Cl.³ .............................................. H04B 1/16
[52] U.S. Cl. .................................. 455/195; 455/170; 455/196
[58] Field of Search ........................ 455/169, 184-186, 455/195, 196, 170, 173, 179

[56] References Cited

U.S. PATENT DOCUMENTS

| | | | |
|---|---|---|---|
| 3,803,494 | 4/1974 | Howell et al. ........................ | 455/185 |
| 3,922,609 | 11/1975 | Grohmann ............................ | 455/184 |
| 4,110,695 | 8/1978 | Klank et al. .......................... | 455/184 |
| 4,161,698 | 7/1979 | Klank ................................... | 455/196 |
| 4,201,943 | 5/1980 | Klank ................................... | 455/185 |
| 4,263,581 | 4/1981 | Okatani et al. ....................... | 455/170 |
| 4,267,601 | 5/1981 | Umeda et al. ........................ | 455/173 |
| 4,271,528 | 6/1981 | Brown .................................. | 455/170 |
| 4,281,415 | 7/1981 | Rock, Jr. .............................. | 455/173 |

Primary Examiner—Jin F. Ng
Attorney, Agent, or Firm—Spencer & Kaye

[57] ABSTRACT

In a tuning circuit for tuning a receiver to a desired broadcast frequency, which tuning circuit includes a source of counting pulses indicating the magnitude of the change in the frequency value to which the circuit is to be tuned, a counter connected to receive the counting pulses and to assume a count state representative of the broadcast frequency to which the circuit is to be tuned, and a timing member for producing a tuning signal having a value determinative of the frequency to which the circuit is tuned during a tuning operation, the timing member is provided with a unit connected to the source of counting pulses for deriving a control signal representative of the frequency of the pulses, and a unit connected for varying the tuning signal in accordance with the control signal in such a manner that as the frequency of the counting pulses increases, the rate of change of the frequency to which the circuit is tuned is increased.

5 Claims, 4 Drawing Figures

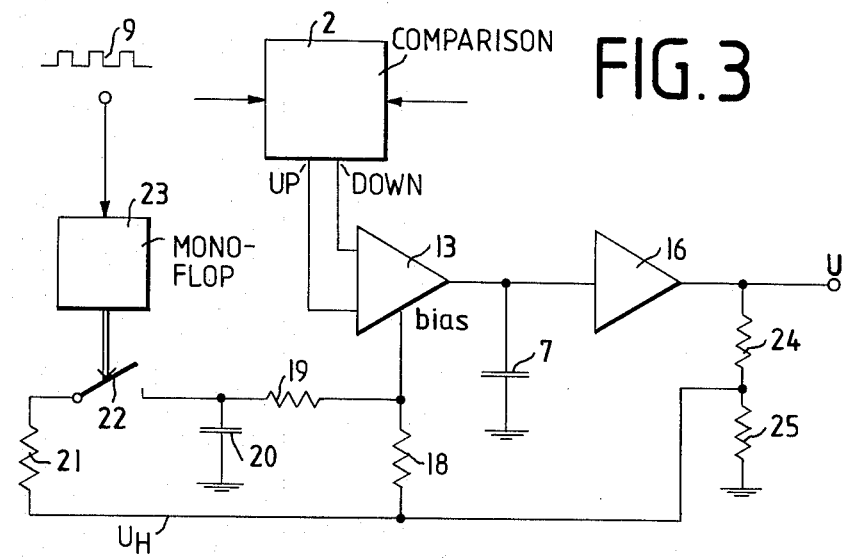
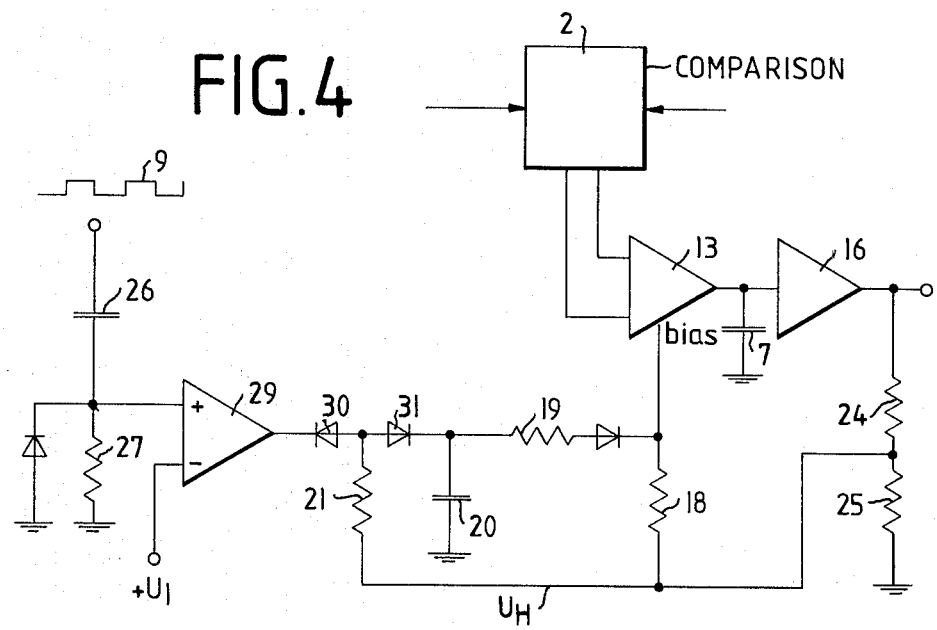

BROADCAST RECEIVER TUNING CIRCUIT

BACKGROUND OF THE INVENTION

A number of known tuning systems, such as those disclosed in German Offenlegungsschrift [Laid-open Application] No. 2,703,861 and German Offenlegungsschrift No. 2,720,170, corresponding to allowed U.S. Pat. No. 4,195,314, include a counter whose counter state determines the frequency to which the receiver is tuned, or the tuned frequency, and can be varied up or down by means of counting pulses. The content of the counter stages thus controls the tuning process.

Such a tuning circuit has the characteristic that the frequency to which it is tuned changes in small steps since each counting pulse advances the counter by one counting step. A timing member in the tuning circuit can be used to limit the rate of change of the tuned frequency, thus preventing the step-wise setting of the tuning system from being undesirably felt, for example, in the low frequency portion of the receiver. The timing member also prevents overshooting of the circuit beyond a tuned frequency given by a certain counter state. The timing member gives the tuning circuit a certain inertia, which is necessary, however, to avoid the above-mentioned drawbacks. The result of this inertia is that the tuning circuit is unable to follow rapid changes of the counter state in every case. However, particularly in connection with radio receivers, there exists the requirement of being able to quickly change the tuned frequency between two widely diverging values within a set tuning band.

SUMMARY OF THE INVENTION

It is an object of the present invention to provide a tuning circuit which can follow any change in the counter state with a negligible time delay, without reintroducing any of the drawbacks already avoided by prior art circuits.

This and other objects are achieved, according to the present invention, in a tuning circuit for tuning a receiver to a desired broadcast frequency, which tuning circuit includes a source of counting pulses indicating the magnitude of the change in the frequency value to which the circuit is to be tuned, a counter connected to receive the counting pulses and to assume a count state representative of the broadcast frequency to which the circuit is to be tuned, and a timing member for producing a tuning signal having a value determinative of the frequency to which the circuit is tuned during a tuning operation, by providing the timing member with means connected to the source of counting pulses for deriving a control signal representative of the frequency of the pulses, and means connected for varying the tuning signal in accordance with the control signal in such a manner that as the frequency of the counting pulses increases, the rate of change of the frequency to which the circuit is tuned is increased.

The invention is based to a substantial extent on the realization that a long time constant is required to suppress interference in the low frequency portion of the receiver only if the position of the counter is changed under control of a low clock pulse frequency. Interfering, sudden changes in the set tuned frequency will occur, in particular, if the tuning circuit is able to directly follow changes in the counter content and reaches the tuning frequency, for example, before the counter receives the next clock pulse. Taking advantage of this realization, the tuning circuit according to the present invention provides a timing member which is regulatable in dependence on the counting frequency of the counter.

BRIEF DESCRIPTION OF THE DRAWING

FIG. 3 is a circuit diagram of another embodiment of the circuit portion of FIG. 2.

FIG. 4 is a circuit diagram of a practical form of construction of the circuit of FIG. 3.

DESCRIPTION OF THE PREFERRED EMBODIMENTS

Figure 1:
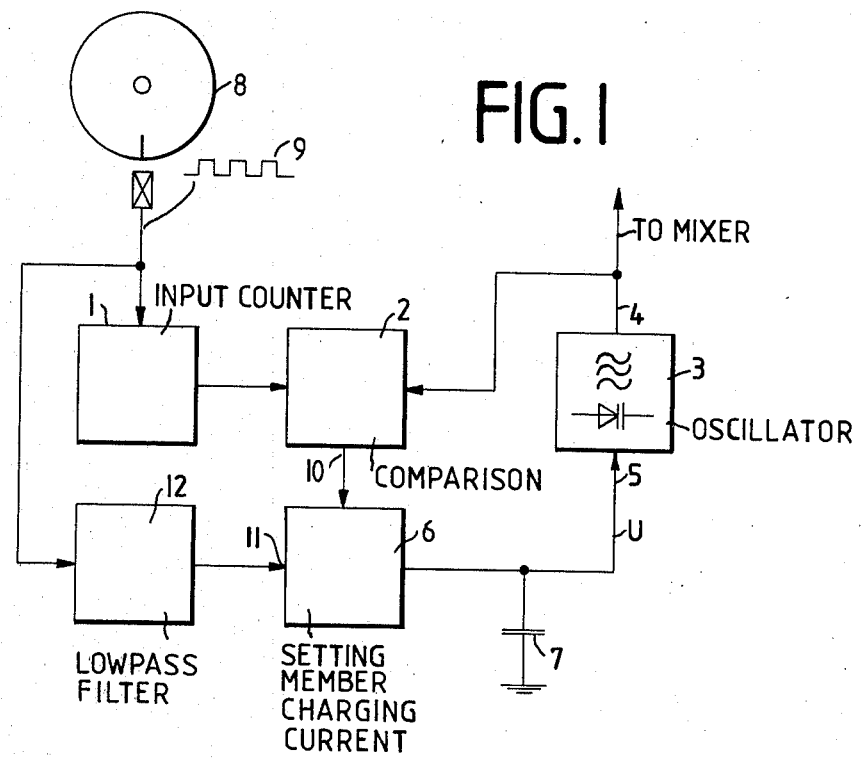
FIG. 1 is a block circuit diagram of a tuning circuit according to a preferred embodiment of the invention.

FIG. 1 shows part of a tuning circuit for a superheterodyne receiver including a mixer, or local, oscillator 3. The output signal at the output 4 of the oscillator 3 is fed to the mixer stage of the receiver (not shown in detail). The oscillator 3 is part of a control circuit which also includes circuit blocks 1, 2, 6 and a capacitor 7. The block 1 is an input counter whose counter state can be varied by application of counting clock pulses 9 derived from a hand, or thumb, wheel 8. Circuits are known in which the counter 1 can be switched to count up or down depending on the direction of rotation of the wheel 8. One such suitable circuit is disclosed, for example, in German Offenlegungsschrift No. 2,703,861, cited above. The frequency of the incoming clock pulses 9 is dependent on the rate of rotation of the wheel 8.

The content of counter 1 is fed to a circuit member 2 which monitors whether the instantaneous counter state of counter 1 matches the instantaneous output frequency of the oscillator 3. The circuit 2 is designed in such a manner that a certain value of the frequency of the output from oscillator 3 is assigned to each counter state. The counter may be, for example, a circuit constructed to include a microprocessor.

Various known forms of construction can be employed for the circuit member 2. For example, the circuit member 2 could be designed in such a way that the value of the frequency of oscillator 3 is determined in a frequency counter circuit and the content of that frequency counter circuit is then compared with the content of the input counter 1 as described in U.S. Pat. No. 4,110,695. In dependence on the result of the comparison, a control signal is then emitted at the output 10 of the circuit member 2 to indicate in which direction the frequency of oscillator 3 must be changed to reestablish the association of the values being compared. This control signal from circuit member 2 is delivered via a control input 5 to control oscillator 3.

However, the circuit member 2 may also be designed, for example, in such a way that the circuit operates in the manner of a phase locked loop (PLL). The circuit member 2 then includes a phase comparator whose one input receives, via a programmable divider, the output signal from the oscillator 3 and whose other input receives a reference signal. In this case, the output of counter 1 must be connected to control the dividing ratio for the programmable divider. The control signal for oscillator 3 is the signal at the output of the phase comparator.

If the input signals to circuit member 2 indicate a frequency difference, the output signal at the output 10 of circuit member 2 charges or discharges, depending on the direction of the difference, the capacitor 7 via a setting member 6. The charging current determined by setting member 6 and the capacitance of the capacitor 7 predetermine the time constant with which the output frequency of the oscillator 3, and thus the frequency to which the tuning circuit is tuned, can be varied.

In order for the tuning circuit to be able to follow even rapid changes in the counter state of counter 1, the timing member of the tuning circuit is designed to be regulatable. The setting member 6 which determines the charging current level for the capacitor 7 can be set via an input 11. That input 11 receives a control signal which matches the magnitude of the charging current produced by member 6 during the follow-up regulation to the clock pulse frequency of the clock pulses 9 at the input of counter 1.

The control signal for the input 11 of setting member 6 is obtained in a circuit member 12 from the train of clock pulses 9. The limit for the tuning rate at every clock pulse frequency of the counting pulses 9 is so low that the frequency of the oscillator changes as steadily as possible. This avoids interference in the low frequency portion of the receiver. It would be particularly annoying if the control circuit, during setting to a new frequency, would cause the frequency to overshoot the desired value. The clock pulse frequency can for example have a range from 1 to 60 pulses per second. In a tuning circuit without the circuit member 12 the tuning frequency could only follow the pulses up to 8 impulses per second. Each pulse can for example change the tuning frequency in a step of 50 kHz/sec. The circuit in FIG. 1 can follow the pulses up to a pulse frequency of 60 pulses per second.

Figure 2:
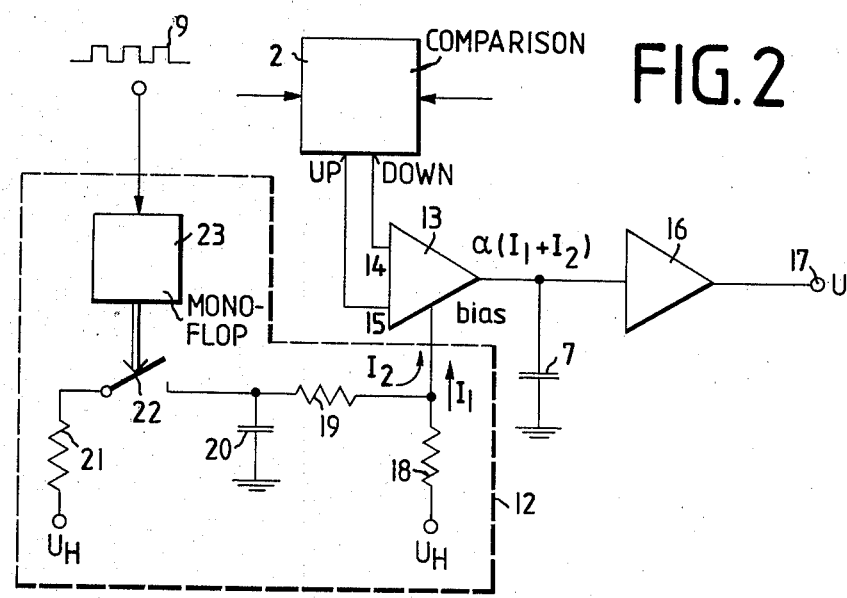
FIG. 2 is a circuit diagram of an embodiment of a portion of the circuit of FIG. 1.

FIG. 2 shows one preferred embodiment of the circuit member 12 of FIG. 1. The charging current for the capacitor 7 is furnished by a differential current amplifier 13 constituting the setting member. The direction of the current furnished by the current amplifier 13 is controlled by circuit member 2 via the inputs 14 and 15 of the current amplifier 13. The magnitude of the current is determined by the signal supplied to the bias input of amplifier 13. Depending on the type of signals present at inputs 14 and 15, the set current flows in one direction or the other or no current will flow. Such a switchable and controllable current amplifier is known, for example, in the form of an integrated circuit such as the RCA circuit type CS 3080. The voltage across the capacitor 7 is fed, via a separating amplifier 16, to the output terminal 17 which is connected to the control input 5 of the oscillator 3 of FIG. 1.

A resistor 18 connected between the bias control input of the amplifier 13 and a point in the circuit at which there is present an auxiliary voltage $U_H$ gives a minimum value, $\alpha I$, for the charging current where $\alpha$ is the current gain factor of the amplifier 13 and $I_1$ is the current through the resistor 18.

A second current $I_2$ is fed to the bias control input of the amplifier 13. This current $I_2$ is obtained from a capacitor 20. The capacitor 20 is fed from a source of auxiliary voltage $U_H$ via a resistor 21 and an electronic switch 22. For this purpose, the pulse voltage 9 is fed to a circuit 23 which operates as a monostable multivibrator, or monoflop. In the circuit 23 pulses of constant pulse width are generated. The electronic switch 22 is actuated by the output pulses from circuit 23.

Since the total time of charging of capacitor 20 varies proportionally with the frequency of the clock pulses 9, the voltage across capacitor 20 is essentially proportional to the frequency of the clock pulses 9. The current component $I_2$ occurring as a charging current $\alpha \cdot I_2$ at the output of the amplifier 13 is thus directly dependent on the frequency of the clock pulses 9 in such a manner that the charging current increases with increasing frequency of the clock pulses 9. In this way, the rate of change of the tuning circuit frequency, predetermined by the timing member composed of amplifier 13 and capacitor 7, is varied in response to changes in the frequency of the incoming clock pulses 9. The time behavior of the tuning circuit is thus adapted in each case to the frequency of the clock pulses 9.

The circuit of FIG. 3 is a modification of the circuit of FIG. 2. The same circuit components bear the same reference numerals. The auxiliary voltage $U_H$ has no fixed value but is derived from the tuning voltage U occurring across the output of an amplifier 16 furnishing the tuning voltage to the oscillator 3 of FIG. 1. A voltage divider including resistors 24 and 25 serves to establish the desired relation between voltages U and $U_H$. In this way the tuning speed of the tuning circuit is made essentially constant over the entire tuning range and the nonlinearity of the tuning speed of the superheterodyne oscillator 3 of FIG. 1 is compensated. German Offenlegungsschrift No. 2,718,472, corresponding to U.S. Pat. No. 4,201,943, discloses the control of the charging current of a timing member in a tuning circuit in dependence on the tuning voltage.

In the circuit of FIG. 3 the voltage across the capacitor 20 is dependent on the product of the auxiliary voltage $U_H$, which is dependent on the tuning voltage, and the frequency of the clock pulses 9. This double dependency assures in a simple manner that the influence of the frequency of the clock pulses 9 on the rate of change of the tuning circuit is also essentially linear over the entire tuning range.

FIG. 4 shows the circuit of FIG. 3 equipped with a specific embodiment of the circuit 23 and the electronic switch 22. The pulse signal 9 is differentiated in a differentiating member including a capacitor 26 and a resistor 27 and the differentiated signal is supplied to the noninverting input of an operational amplifier 29 where it is amplified to pulses of constant width. The circuit operates flawlessly if the level of the pulse voltage 9 is greater than the positive voltage $U_1$ present at the inverting input of the amplifier 29.

If no pulse is present at the output of the amplifier 29, the output is connected to ground potential so that, due to the positive auxiliary voltage $U_H$, the diode 30 is conductive. The diode 31, however, is blocked.

At the occurrence of a pulse at the output of the amplifier 29, the diode 30 is blocked and a charging current flows, due to the auxiliary voltage $U_H$, through resistor 21 and the now conductive diode 31 to the capacitor 20. Otherwise the circuit operates the same as the circuit shown in FIG. 3.

It will be understood that the above description of the present invention is susceptible to various modifications, changes and adaptations, and the same are intended to be comprehended within the meaning and range of equivalents of the appended claims.

What is claimed is:

1. In a tuning circuit for tuning an oscillator of a receiver to a desired broadcast frequency, which tuning circuit includes a source of counting pulses indicating the magnitude of the change in the frequency value to which the circuit is to be tuned, a counter connected to the source of counting pulses to receive the counting pulses and to assume a count state corresponding to the number of counting pulses received and representative of the broadcast frequency to which the circuit is to be tuned, means for comparing the output of the counter and the oscillator to provide an output indicating the difference in frequency there between, and a timing member connected to receive the output of said comparing means for producing a tuning signal having a value determinative of the frequency to which the circuit is tuned during a tuning operation, the improvement comprising means connected to said source of counting pulses for deriving a control signal representative of the frequency of said pulses, and means connecting said control signal deriving means to said timing member for varying said tuning signal in accordance with said control signal in such a manner that as the frequency of said counting pulses increases, the rate of change of the frequency to which said circuit is tuned is increased.

2. An arrangement as defined in claim 1 wherein said timing member comprises a capacitor providing a voltage representative of said tuning signal, and a current source supplying said capacitor with current having a magnitude determined by said control signal.

3. An arrangement as defined in claim 1 wherein said means for deriving a control signal comprises: means connected for forming pulses of constant width from said counting pulses; and filter means connected to derive a direct voltage signal having an amplitude proportional to the average value of the pulses of constant width, which direct voltage signal constitutes the control signal.

4. An arrangement as defined in claim 3 wherein said means for deriving a control signal further comprises a source of an auxiliary voltage determining the amplitude of the pulses of constant width and varying in value with the tuning signal.

5. An arrangement as defined in claim 4 wherein said source of an auxiliary voltage operates to cause the value of the auxiliary voltage to be proportional to the value of the tuning voltage.

* * * * *